United States Patent [19]

Pulice

[11] Patent Number: 5,159,293
[45] Date of Patent: Oct. 27, 1992

[54] VOLTAGE-CONTROLLED OSCILLATOR WITH WIDE MODULATION BANDWIDTH

[75] Inventor: Gerald F. Pulice, Skillman, N.J.

[73] Assignee: Smiths Industries, N.J.

[21] Appl. No.: 812,564

[22] Filed: Dec. 20, 1991

[51] Int. Cl.$^5$ .............................................. H03B 5/12
[52] U.S. Cl. .......................... 331/177 V; 331/DIG. 3
[58] Field of Search .............. 331/96, 107 SL, 117 R, 331/117 FE, 117 D, 177 V, DIG. 3

[56] References Cited

U.S. PATENT DOCUMENTS 3,613,029 10/1971 Bartlett ..................... 331/DIG. 3 X
4,003,004 1/1977 Fletcher et al. ............ 331/177 V X
4,918,406 4/1990 Baumbach et al. ........ 331/177 V X Primary Examiner—David Mis
Attorney, Agent, or Firm—Anthony J. Casella; Gerald E. Hespos

[57] ABSTRACT

A voltage-controlled oscillator capable of very high ratios of modulation to oscillation frequency is disclosed embodying a resonant circuit with an inductance and two tuning diodes connected with opposite polarity in series across the inductance, a cross-coupled feedback amplifier circuit with two matched MMIC inverting amplifiers capacitively cross-coupled to the resonant circuit for driving the resonant circuit into oscillation at its resonant frequency to produce an output carrier wave, and a transmission line resonator connected to the resonant circuit between the tuning diodes to couple a wide band frequency modulating voltage thereto for modulating the output carrier wave.

20 Claims, 3 Drawing Sheets

VOLTAGE-CONTROLLED OSCILLATOR WITH WIDE MODULATION BANDWIDTH

BACKGROUND OF THE INVENTION

1. Field of the Invention

The present invention relates to frequency modulated oscillators and more particularly to a voltage-controlled oscillator that is capable of very high ratios of modulation to oscillator frequency.

2. Prior Art

In frequency modulation (FM), a source of oscillating electrical waves is used to produce an electrical wave at a selected frequency of oscillation (carrier wave) and a modulating signal is imposed on the carrier wave to alter the selected frequency. Typically, the carrier wave is transmitted at a frequency within the radio frequency (RF) band and is picked up by a receiver which removes and uses the modulating signal to reproduce the source of the modulation, such as voice or music sounds or a video image. In its simplest form, the source of the oscillating waves, the oscillator, is composed of a parallel connected electrical inductance and capacitance, the operating values of which are selected to produce the desired frequency of oscillation. Essentially, the parallel connected inductance and capacitance, which are commonly referred to as a tank circuit, trap the energy of an applied voltage and produce a resonating effect that results in the oscillating voltage output at the resonant frequency. Such tank circuits have a quality or Q rating associated with them proportioned to their ability to store electrical energy and thus, produce a strong stable output signal.

A particular prior art oscillator, varactor tuned with a resistive bias network, is shown in FIG. 1. The tank or resonant circuit $T_A$ is formed by the inductance coil $L_A$ and the capacitors $C_A$ and $D_A$. Capacitor $D_A$ is a voltage-variable capacitor or varactor diode which will effect the resonant frequency of the circuit as a function of the applied voltage. A feedback loop consisting of an inductance $L_F$ and an amplifier $A_F$, with an inverted gain $-A$, is connected across inductance $L_A$. A source of tuning voltage $V_T$ is coupled to the oscillator circuit at a point between capacitors $C_A$ and $D_A$ and normally a resistor network $R_A$ is used to isolate the source of tuning voltage $V_T$ from the hi-Q resonant tank circuit of the oscillator. This prior art arrangement is necessarily a compromise because:

1) The presence of the resistor network $R_A$ causes the Q of the resonant tank circuit to be lowered, which compromises the stability and purity of the oscillator's output waveform; and 2) The impedance of the resistor network together with circuit capacitance comprise a low-pass filter that ultimately limits the response of the oscillator circuit to high frequency modulation inputs.

It is accordingly an object of the present invention to provide a voltage-controlled oscillator with an increased modulation bandwidth that overcomes the limitations of the prior art.

SUMMARY OF THE INVENTION

The present invention is directed to eliminating the prior art bandwidth limiting bias circuits used with voltage-controlled oscillators and employs the well matched properties of Microwave Monolithic Integrated Circuits (MMICs) and the low resistance of a Transmission Line Resonator (TLR) to achieve a voltage controlled oscillator (VCO) that is capable of very high ratios of modulation to oscillation frequency. Specifically, the invention embodies two matched MMICs, each with matched series coupled capacitors connected across a tank circuit as inverting RF amplifiers which reverse polarity from input to output and such that the cross-coupled feedback forces the circuit into oscillation at the parallel resonant frequency of an inductance and two oppositely biased identical series tuning diodes forming the tank circuit. At this frequency, the impedance presented to the MMICs is greatest and circuit gain is highest. By symmetry, the RF voltage at each end of the inductance is opposite in polarity and cancels at the center of the two tuning diodes, at which point the tuning voltage can be directly applied. However, since typically the circuit balance is not perfect at this point and RF cancellation is not complete, the tuning voltage is coupled through a non-resistive bias isolation circuit in the form of a transmission line resonator (TLR). The TLR is ¼ wavelength long at the mean frequency of oscillation and is not terminated in its characteristic impedance at the tuning diodes, so that the low impedance of the tuning voltage source is transformed into a high impedance by transmission line action, isolating the tuning voltage source from the oscillator. The unterminated line tends to act as a low pass filter further isolating the diodes from the tuning voltage source and the line has zero resistance so it does not limit the high modulation frequencies as would a resistor. The TLR in ¼ operation has sufficient impedance to function over a wide bandwidth in this arrangement.

The resulting voltage-controlled oscillator circuit may be used to frequency modulate information onto an RF carrier wave generated by the oscillator. By eliminating the usual bandwidth limiting bias circuits, wideband signals such as television images can be carried over an FM system with a high degree of fidelity.

DETAILED DESCRIPTION OF THE PREFERRED EMBODIMENT

Figure 2:
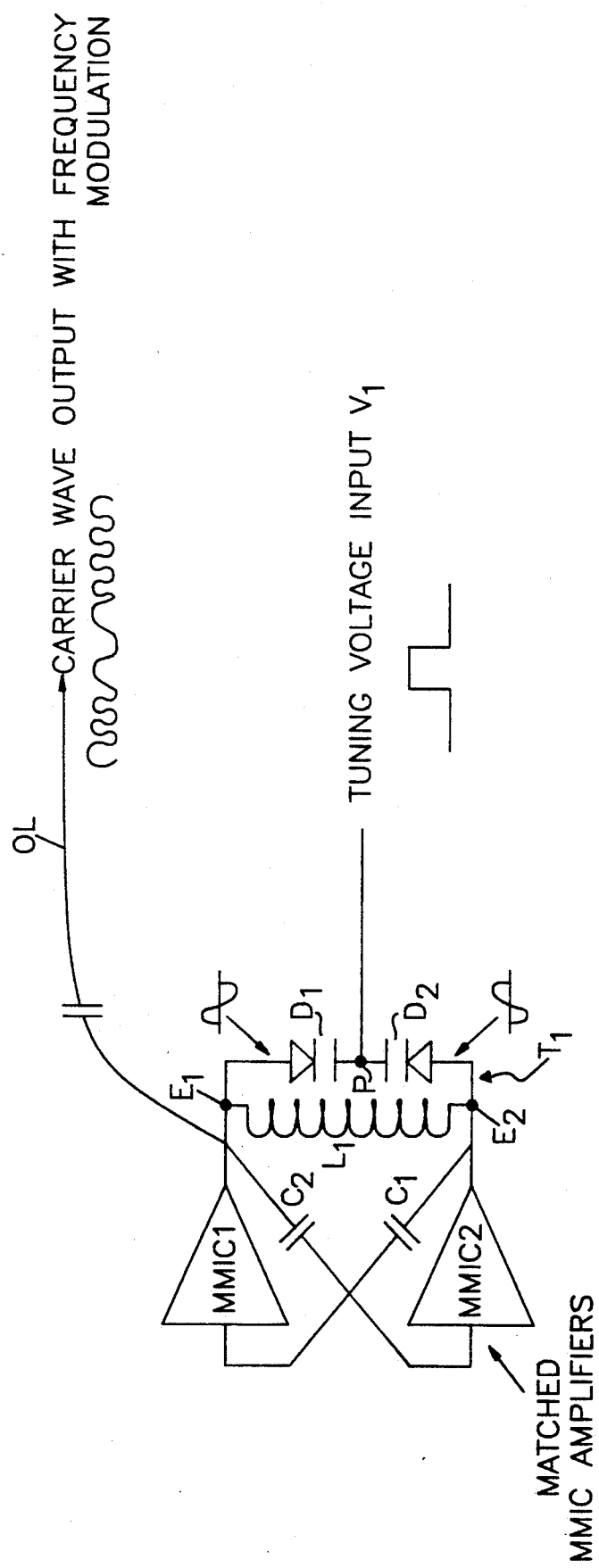
FIG. 2 is a schematic showing of a voltage-controlled oscillator in accordance with the present invention.

A voltage-controlled oscillator in accordance with the present invention is shown in FIG. 2. The oscillating tank circuit $T_1$ is composed of an inductive leg containing an inductance $L_1$ and a capacitive leg including two series tuning diodes $D_1$ and $D_2$ connected with opposite biases across $L_1$ and to each other at the point of imposition P of the tuning voltage input $V_1$. Two microwave monolithic integrated circuit inverting RF amplifiers, MMIC1 and MMIC2, preferably fabricated on the same substrate for close matching, have their outputs coupled to the opposite ends, $E_1$, $E_2$, of the tank circuit $T_1$, and each is connected by means of a respective series matched capacitor, $C_1$, $C_2$, across the tank circuit $T_1$ in a feedback loop. Since these amplifiers, MMIC1 and MMIC2, reverse polarity from input to output, the cross-coupled feedback forces the circuit into oscillation at the parallel resonant frequency of inductance $L_1$ and the two series tuning diodes $D_1$ and $D_2$. At this resonant frequency, the impedance presented to the push-pull MMIC arrangement is greatest and circuit gain is highest. With capacitors $C_1$ and $C_2$ identical in value, by symmetry the RF voltage at each end, $E_1$, $E_2$, of inductance $L_1$ is opposite in polarity as shown by the wave indications in FIG. 2. Thus, the voltage tends to cancel at the center point P between the two identical tuning diodes $D_1$ and $D_2$. The tuning voltage input $V_1$ is coupled to the circuit at point P. If the circuit balance was perfect and RF cancellation complete at point P the direct application of the tuning voltage $V_1$ could be effected without problem. However, as this condition is frequently not the case, additional means must be used to accommodate to any problems that may arise from a lack of perfect balance.

Figure 3:
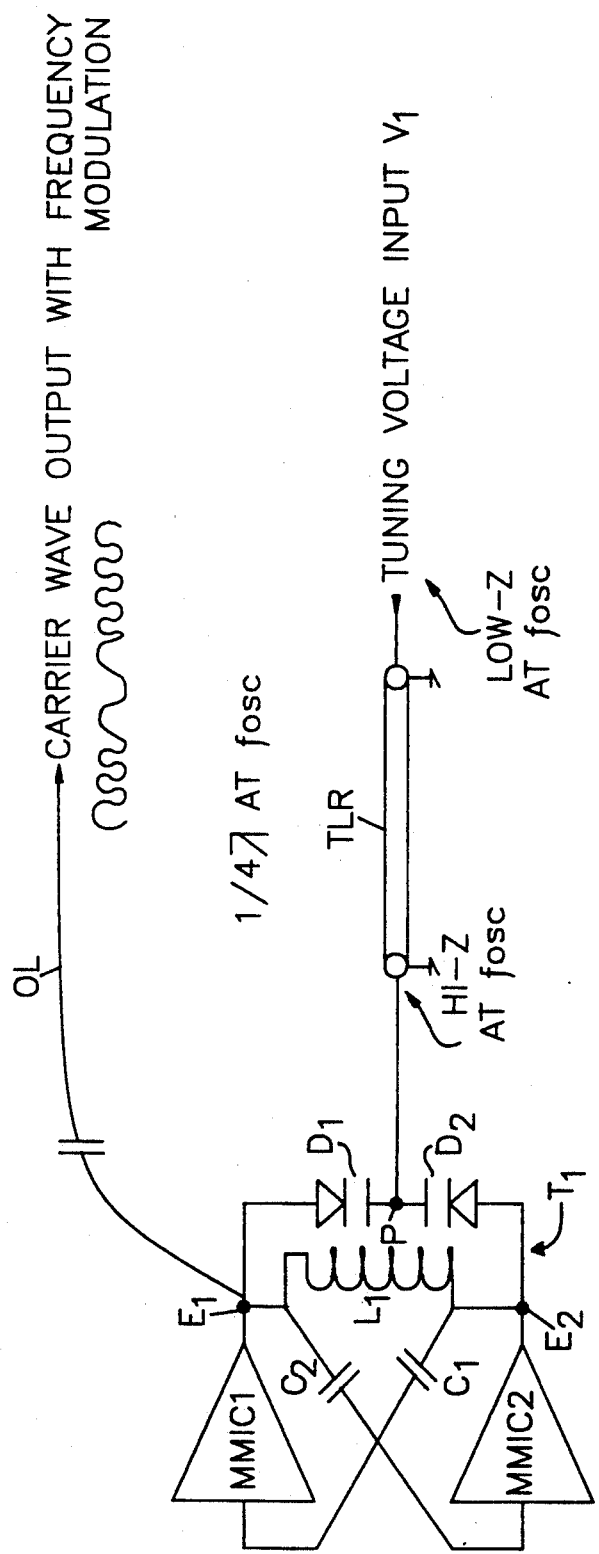
FIG. 3 is a schematic showing of a preferred embodiment of the oscillator of the present invention including a transmission line resonator.

A solution to the unbalance situation in accordance with the present invention involves the addition of non-resistive bias isolation circuit in the tuning voltage input line to isolate the source of the tuning voltage $V_1$ from the resonant tank circuit $T_1$. As seen in FIG. 3, the isolation circuit may consist of a low resistance transmission line resonator (TLR) with ¼ wavelength electrical length. The connection of the resonator could cause the oscillator to "mode" under normal circumstances, discontinuously jumping to a second frequency controlled by the resonant point(s) of the transmission line. However, in the present arrangement, balance about the tuning voltage point or port P isolates the frequency-controlling tank circuit $T_1$ from the TLR resonance to a degree that tuning voltage control is well-behaved and monotonic.

Figure 1:
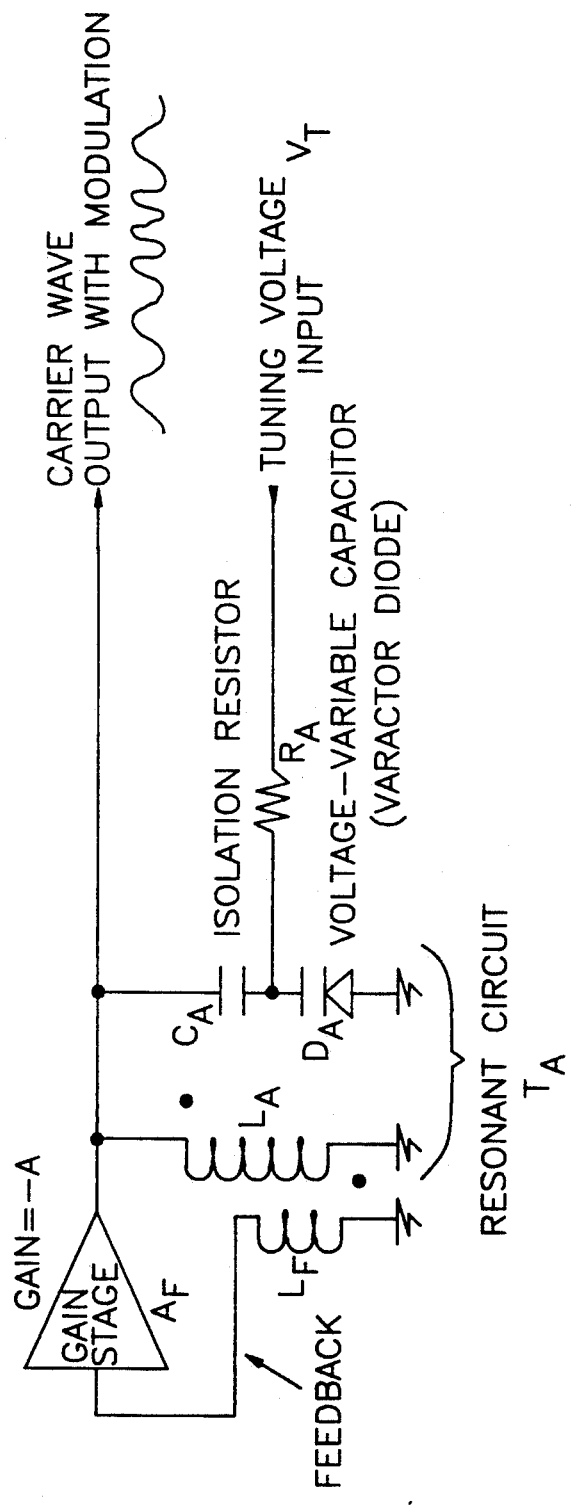
FIG. 1 is a schematic showing of a conventional varactor tuned oscillator with a resistive bias network.

The TLR is ¼ wavelength long at the mean frequency of oscillation $f_{osc}$ and is not terminated in its characteristic impedance at the tuning diodes $D_1$ and $D_2$. As seen in FIG. 3, the TLR has a high impedance at the frequency of oscillation $f_{osc}$ at the end connected to point P while its impedance is low at the end connected to the source of tuning voltage $V_1$. Thus, the low impedance of the tuning voltage source is transformed into a high impedance by transmission line action. This suitably isolates the tuning voltage source from the oscillator at $f_{osc}$. Also, the unterminated line tends to act as a low pass filter further isolating the diodes $D_1$ and $D_2$ from the tuning voltage source. Quite significantly, the line has zero resistance and tends not to limit higher modulation frequencies as would a resistor, such as isolation resistor $R_A$ shown in the prior art circuit in FIG. 1. The TLR has sufficient impedance to function in this application over a wide bandwidth. At the low-impedance series resonant point the TLR impedance will drop to zero but the oscillator will continue to function with reduced isolation in this worst case situation.

In operation, as seen in FIG. 3, the oscillator circuit produces an FM carrier wave on output line OL, which line is capacitively coupled to point $E_1$ of the tank circuit $T_1$ and conducts the carrier wave to a utilization device, such as a TV receiver. The carrier wave frequency will normally be the resonant frequency of oscillation of circuit $T_1$. The matched MMIC amplifier arrangement amplifies and stabilizes this oscillation frequency by damping stray frequencies and balancing the voltage at tuning frequency input port P. The tank circuit $T_1$, including inductance $L_1$ and matched varactor diodes $D_1$ and $D_2$, oppositely biased, along with the cross-coupled feedback amplification circuit, including MMIC1 and MMIC2 and capacitors $C_1$ and $C_2$, form a stable oscillator which produces a strong, and well defined frequency, carrier output wave.

In order to impose wideband signals on the carrier wave, a controlling voltage is input at point P in the tank circuit $T_1$ to regulate the tuning of the resonant frequency. However, the presence of a resistor network in connection with this input will lower the Q of the tank circuit, compromising the stability and purity of the output waveform, and together with circuit capacitance will form a low-pass filter limiting circuit response to high frequency modulation inputs. To avoid these adverse effects, a TLR is connected between point P and the source of tuning voltage $V_1$. The TLR is such as to produce a high impedance at point P and a low impedance on the side of the tuning voltage source at the frequency of oscillation, thus, isolating the tuning voltage source from the oscillator. The zero resistance of the input line does not limit the high modulation frequencies so that the carrier wave can be subjected to a wide range of modulation frequencies and the oscillator is capable of being tuned with high ratios of modulation to oscillation frequency. Consequently, the stable carrier wave generating oscillator circuit can be tuned over a wide bandwidth of modulation frequencies so that wideband signals such as those of television can be carried over an FM broadcasting system with a high degree of fidelity.

It will therefore be seen that a voltage-controlled oscillator with a wide modulation bandwidth has been presented that will find many applications in FM systems, including FM systems for transmissions of video signals.

I claim:
1. A voltage-controlled oscillator comprising:
   resonant circuit means, including an inductance and two varactors connected with opposite polarity in series across said inductance, for producing a resonant frequency output wave;
   cross-coupled feedback means, including two matched MMIC inverting amplifiers connected across said resonant circuit means with their outputs respectively coupled to opposite ends of said inductance and with matched capacitors respectively connected to their inputs, which capacitors have their opposite ends coupled to the opposite ends of said inductance from their respective amplifier outputs, for driving said resonant circuit means into oscillation at its resonant frequency to produce said output wave; and
   means for applying a tuning voltage to said resonant circuit means between said varactors to modulate said resonant frequency and said output wave.

2. An oscillator as in claim 1, wherein said means for applying a tuning voltage comprises a transmission line resonator.

3. An oscillator as in claim 2, wherein said transmission line resonator is a ¼ wavelength long at the mean frequency of oscillation of said resonant circuit means.

4. An oscillator as in claim 1, wherein said MMIC amplifiers are fabricated on the same substrate for close matching.

5. An oscillator as in claim 1, wherein said means for applying a tuning voltage comprises means for producing a wide frequency bandwidth signal.

6. A voltage-controlled oscillator comprising:
   resonant means, comprising an inductive leg and a parallel capacitive leg, for producing a resonant frequency output;

feedback means, comprising two inverting amplifiers capacitively cross-coupled to said resonant means, for driving said resonant frequency output; and tuning means, coupled to said capacitive leg, for modulating said resonant frequency output.

7. An oscillator as in claim 6, wherein said capacitive leg comprises two tuning diodes connected with opposite polarity in series across said inductive leg.

8. An oscillator as in claim 7, wherein said tuning means is coupled to said capacitive leg at a point between said tuning diodes.

9. An oscillator as in claim 6, wherein said amplifiers comprise matched MMIC amplifiers.

10. An oscillator as in claim 9, wherein said MMIC amplifiers are capacitively cross-coupled to said resonant means by matched capacitors respectively connected to the inputs of said amplifiers.

11. An oscillator as in claim 6, wherein said tuning means comprises a transmission line resonator.

12. An oscillator as in claim 11, wherein said tuning means comprises means for providing a wideband frequency modulating voltage.

13. An oscillator as in claim 11, wherein said resonator is a ¼ wavelength long at the mean frequency of said resonant frequency output.

14. An oscillator as in claim 6, wherein said amplifiers comprise MMIC amplifiers fabricated on the same substrate.

15. A system for producing an oscillation frequency carrier wave including an oscillator circuit and an amplifier circuit connected in parallel;

said oscillating circuit comprising an inductance and two tuning diodes connected in series with opposite polarity across the ends of said inductance;

said amplifier circuit comprising two MMIC inverting amplifiers capacitively cross-coupled to said inductance ends to drive said oscillating circuit to produce said oscillation frequency carrier wave; and means for modulating said oscillation frequency carrier wave comprising means for coupling a wide bandwidth frequency signal to said oscillating circuit between said tuning diodes.

16. A system as in claim 15, wherein said means for coupling a wide bandwidth frequency signal comprises a transmission line resonator.

17. A system as in claim 16, wherein said resonator is a ¼ wavelength long at the mean frequency of oscillation of said carrier wave.

18. A system as in claim 15, wherein said MMIC amplifiers are fabricated on the same substrate for close matching.

19. A system as in claim 15, wherein said MMIC amplifiers are capacitively cross-coupled to said inductance ends by identical capacitors respectively connected to the inputs of said amplifier.

20. A system as in claim 15 further comprising an output line capacitively coupled to one of said inductance ends for conducting said oscillating frequency carrier wave to a utilization device.

* * * * *